(12) United States Patent
Sawai et al.

(10) Patent No.: US 6,717,263 B2
(45) Date of Patent: Apr. 6, 2004

(54) SEMICONDUCTOR DEVICE HAVING CONTACT OPENING SMALLER THAN TEST PROBE, AND MANUFACTURING PROCESS AND INSPECTING METHOD THEREOF

(75) Inventors: Keiichi Sawai, Fukuyama (JP); Osamu Jinushi, Kasaoka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/282,012

(22) Filed: Oct. 29, 2002

(65) Prior Publication Data

US 2003/0080421 A1 May 1, 2003

(30) Foreign Application Priority Data

Oct. 31, 2001 (JP) .......................... 2001-334892

(51) Int. Cl.[7] .......................... H01L 23/48; H01L 23/52
(52) U.S. Cl. .......................... 257/737; 257/773
(58) Field of Search .................... 257/737, 773

(56) References Cited

U.S. PATENT DOCUMENTS 5,965,943 A * 10/1999 Mizuta .................. 257/763

6,426,556 B1 * 7/2002 Lin ........................ 257/738

FOREIGN PATENT DOCUMENTS

JP 2000-021939 1/2000

* cited by examiner

Primary Examiner—Son Mai
Assistant Examiner—Tu-Tu Ho
(74) Attorney, Agent, or Firm—Nixon & Vanderhye, P.C.

(57) ABSTRACT

In a semiconductor chip mounted in a semiconductor device, when an opening portion (2) is formed in a surface protective film (14) on a pad (13), the opening portion (2) is so formed as to have a plurality of openings (15), each smaller than a tip diameter of a probe needle (17) and arranged in a grid pattern or stripe pattern. In this configuration, electrical continuity is achieved between the probe needle (17) and the pad (13) through a bump electrode (16) if the bump electrode is properly formed. Electrical continuity between the probe needle (17) and the pad (13) is prevented by the opening (15) and is not achieved if the bump electrode (16) is improperly formed.

11 Claims, 7 Drawing Sheets

SEMICONDUCTOR DEVICE HAVING CONTACT OPENING SMALLER THAN TEST PROBE, AND MANUFACTURING PROCESS AND INSPECTING METHOD THEREOF

BACKGROUND OF THE INVENTION

1. Field of the Invention

The present invention relates to a semiconductor device comprising a semiconductor chip having bump electrodes thereon. The present invention relates also to a manufacturing process and an inspecting method of the semiconductor device.

2. Description of the Prior Art

Electronic apparatuses such as a mobile information terminal have been made smaller and lighter in recent years. Accordingly, demands for a smaller and lighter semiconductor integrated circuit device (hereinafter semiconductor device) for use in such electronic apparatuses have been growing. One of popular methods for making the semiconductor device smaller and lighter is to form so-called bump electrodes at predetermined spots on a surface of the semiconductor device. Then, the semiconductor device is mounted on a printed circuit board through the bump electrodes together with other electronic components.

In practicing the above-mentioned method, it is important that all of the bump electrodes should be formed on a semiconductor chip without missing any one of them. A failure to do so would lead to a defective semiconductor device as a whole, because, if a semiconductor chip having a partially missing bump electrode is mounted on a semiconductor device due to a trouble or the like during a process of forming the bump electrodes, a proper electrical connection is not achieved between the semiconductor device and a conductor pattern formed on the printed circuit board.

Usually, visual inspections are conducted in many cases when the bump electrodes formed in the semiconductor device are checked because a missing or incomplete bump electrode can not be detected by a wafer test alone. This is because, in a conventional semiconductor device, a bump electrode is so formed as to make a contact with a pad through an opening formed on the pad in a surface protective film that is laid on the semiconductor chip. As the opening is larger than a diameter of a probe needle used for the wafer test, the probe needle detects identical electrical characteristics during the wafer test performed after forming the bump electrode regardless of whether the bump electrode is complete or incompletely.

In other words, when the bump electrode is properly formed, electrical continuity is achieved between the probe needle and the pad through the bump electrode. When the bump electrode is missing, the probe needle penetrates through the opening and comes in contact with the pad directly. As a result of this, electrical continuity is achieved between the probe needle and the pad, and identical electrical properties are detected as is the case for the properly formed bump electrode.

In this case, because electrical continuity is achieved between the probe needle and the pad regardless of whether the bump electrode is completely or incompletely formed and the electrical characteristics test during the wafer test does not reflect the existence of the incompletely formed bump electrode, the wafer test can not detect the missing bump electrode. This causes necessity of the visual inspection as described previously.

However, as a wafer diameter becomes larger and a semiconductor device increases its performance and features, a number of input and output terminals on the semiconductor device has been phenomenally increased. As a result, this has made the visual inspection practically impossible. Although there are automated inspection apparatuses using an image recognition system to inspect the bump electrodes for incomplete formation thereof or the like, these apparatuses are expensive and, therefore, can not be easily put into use.

As one example of conventional semiconductor devices that make detection of incomplete bump electrodes possible without requiring any special apparatuses, Japanese Patent Application Laid-Open No. 2000-21939 discloses a semiconductor chip and its inspecting method, wherein electrode terminals for inspecting bump electrode formation are formed on the semiconductor chip and existence of the incomplete bump electrode is detected by measuring electrical characteristics on the electrode terminals.

FIG. 10 shows a simplified plan view of a semiconductor chip 100 mounted in the semiconductor device disclosed in Japanese Patent Application Laid-Open No. 2000-21939.

In a configuration shown in FIG. 10, 116 is a bump electrode and 113 is a pad for external connection. Also, electrode terminals 101a to 101d for inspecting bump electrode formation are arranged along edges of corners of the semiconductor chip 100. When results obtained by measuring the electrode terminals 101a to 101d are not equal to desired characteristics, it is concluded that the semiconductor chip is defective as having an incomplete bump electrode.

According to the above-mentioned disclosure, it is assumed possible to find, without relying on visual checking conducted manually, whether the semiconductor chip 100 is defective or not through detecting incomplete formation of the bump electrode automatically. Therefore, it is assumed also possible to reduce time required for visual checking conducted on the semiconductor chip after the wafer test and to contribute to reducing production cost of semiconductor chip comprising the bump electrodes.

However, in the configuration disclosed in Japanese Patent Application Laid-Open No. 2000-21939 as shown in FIG. 11, the semiconductor chip 100 has the bump electrodes among which only about 90% are completely formed, because the semiconductor chip 100 is taken from a perimeter area of the wafer. According to this configuration, incomplete bump electrodes formed at around the corners of the semiconductor chip 100, for example, an incomplete bump electrode formed in an incomplete bump area 102, can be detected. However, an incomplete bump electrode formed in different areas than the areas in which the electrode terminals 101a to 101d are provided, in other words, an incomplete bump electrode formed in areas other than the corners can not be detected.

Because a semiconductor chip having an increased number of terminals has a higher probability of having the bump electrodes being incompletely formed in areas other than four corners, conventional semiconductor devices including those disclosed in Japanese Patent Application Laid-Open No. 2000-21939 may not be easily checked for incomplete bump electrodes that are supposed to be formed in any given areas or in any other areas than the four corners. Therefore, it may be possible that the semiconductor devices with incomplete bump electrodes are shipped. Consequently, this contributes to reducing reliability of said semiconductor devices.

SUMMARY OF THE INVENTION

An object of the present invention is to provide a semiconductor device, its manufacturing process, and its inspecting method by which a bump electrode formed improperly in the semiconductor device is detected by simple means without using a specially arranged apparatus.

To achieve the above object, according to the present invention, a semiconductor device comprises a semiconductor chip, a pad formed at a predetermined location on a surface of the semiconductor chip, a surface protective film formed on the surface of the semiconductor chip except on a part of a surface of the pad, an opening portion left in the surface protective film on said part of the surface of the pad, and a bump electrode formed through the opening portion so as to contact with the pad, wherein said opening portion comprises one or a plurality of openings having a width thereof smaller than a predetermined value, the opening has a first opening end at a side of the pad and a second opening end at a side opposite to the first opening end, and one width of an overlapping area formed by projecting the first opening end and the second opening end in a direction normal to the surface of the pad is smaller than a tip diameter of a probe needle for measuring electrical characteristics of the semiconductor device.

In the semiconductor device, the opening is arranged in a grid pattern or a stripe pattern.

In the semiconductor device, the opening is formed along a normal line to the surface of the pad or is formed with an inclination to a normal line to the surface of the pad.

According to another aspect of the present invention, a process of producing a semiconductor device comprises forming a pad at a predetermined location on a surface of the semiconductor chip, laying a surface protective film on the surface of the semiconductor chip except on a part of a surface of the pad, and forming a bump electrode through an opening portion left in the surface protective film on said part of the surface of the pad so as to contact with the pad, wherein, when the surface protective film is laid, said opening portion is so formed to have one or a plurality of openings, each having a first opening end at a side of the pad and a second opening end at a side opposite to the first opening end, so that one width of an overlapping area formed by projecting the first opening end and the second opening end in a direction normal the surface of the pad becomes smaller than a tip diameter of a probe needle for measuring electrical characteristics of the semiconductor device.

In the process, the opening is arranged in a grid pattern or a stripe pattern.

In the process, the opening is formed along a normal line to the surface of the pad or is formed with an inclination to a normal line to the surface of the pad.

According to still another aspect of the present invention, a method for testing a semiconductor device having a pad formed at a predetermined location on a surface of a semiconductor chip, a surface protective film laid on the surface of the semiconductor chip except on a part of a surface of the pad, and a bump electrode formed through an opening portion left in the surface protective film on said part of the surface of the pad so as to contact with the pad, the method including bringing a probe needle for measuring electrical characteristics of the semiconductor device in a direction substantially normal the surface of the pad so that the probe needle comes in contact with the semiconductor device, wherein the method comprises detecting the bump electrode as defective if the bump electrode is incompletely formed and an electrical contact between a tip of the probe needle and the pad is prevented by the opening portion so formed as to have an opening of which one side is smaller than a tip diameter of the probe needle.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Hereinafter, an embodiment of the present invention will be described with reference to the accompanying drawings.

Figure 1:
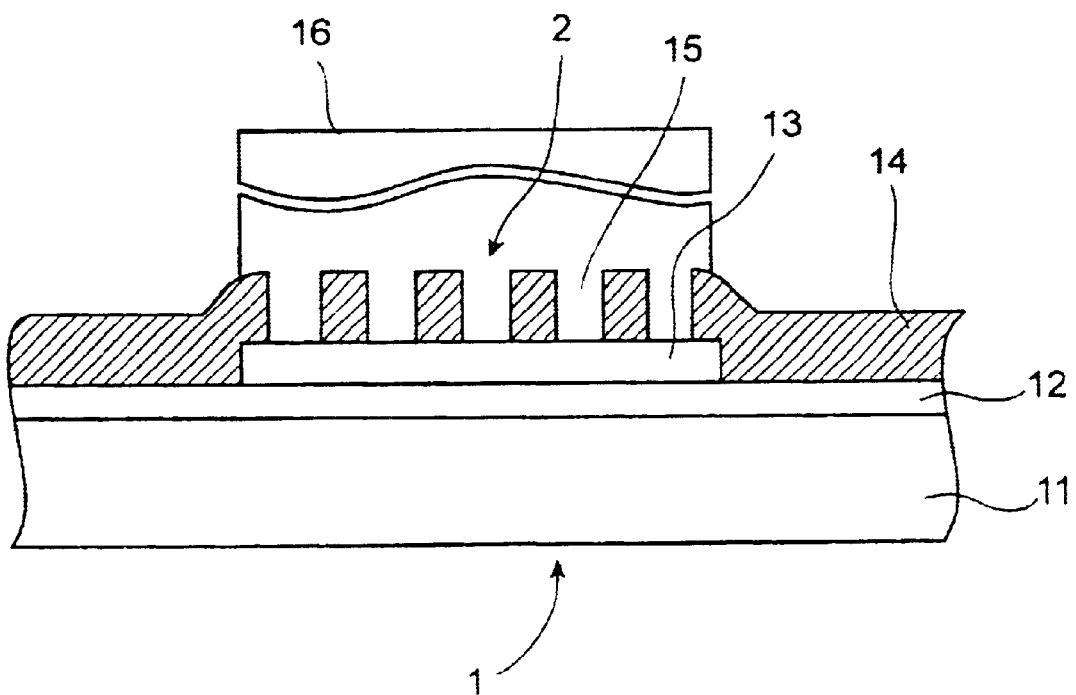
FIG. 1 is a simplified sectional view of the semiconductor device embodying the invention.

FIG. 1 is a sectional view of a semiconductor device 1 of the present invention. As shown in the figure, the semiconductor device 1 comprises a semiconductor chip 11 having a predetermined integrated circuit therein, an insulating film 12 laid on a surface of the semiconductor chip 11, a pad 13 for input and output, a surface protective film 14 for protecting the surface the semiconductor chip 11, and a bump electrode 16 formed so as to keep contact with the pad 13. Furthermore, an opening portion 2 which will be described later is provided in the surface protective film 14 on the pad 13. The opening portion 2 comprises one or a plurality of openings 15 having a shape as described later.

Figure 2:
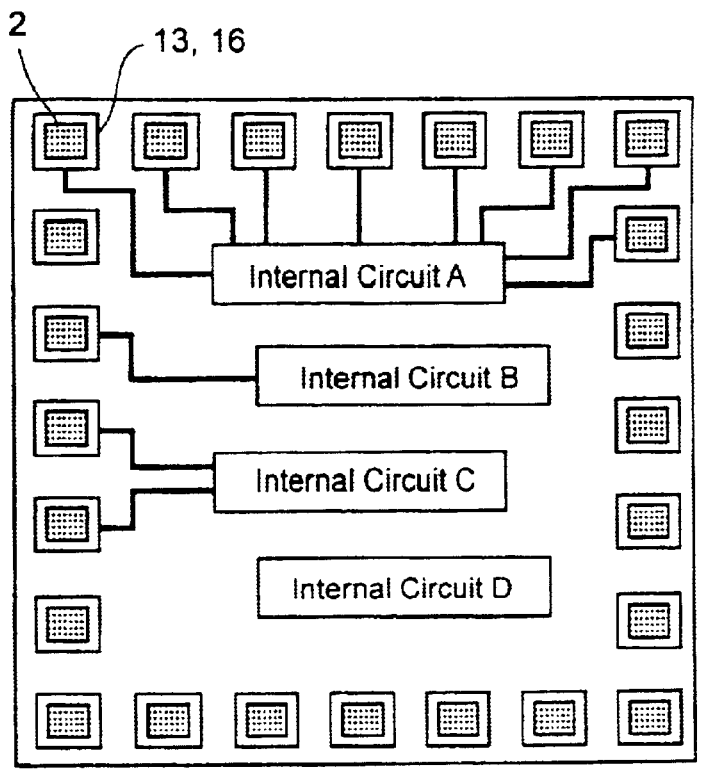
FIG. 2 is a simplified plan view of the semiconductor device embodying the invention.

FIG. 2 is a simplified plan view of the semiconductor device 1. In this figure, it is seen that the bump electrodes 16 are formed on all of the pads 13 without missing any one of them. However, it should be noted that, in the figure, wiring connecting each of the pads 13 with an internal circuit of the semiconductor device 1 is not shown except only a part thereof. Also, an outline shape and dimensions of the pad 13 and the bump electrode 16 are assumed identical, hence the pad 13 and the bump electrode 16 are seen overlapped with each other in plan view as shown in the figure. However, it is also possible to make the outline shape and the dimensions of the pads 13 different from those of the bump electrode 16. A region filled with dots in FIG. 2 indicates the opening portion 2 formed in the surface protective film 14 on the pad 13.

Figure 3:
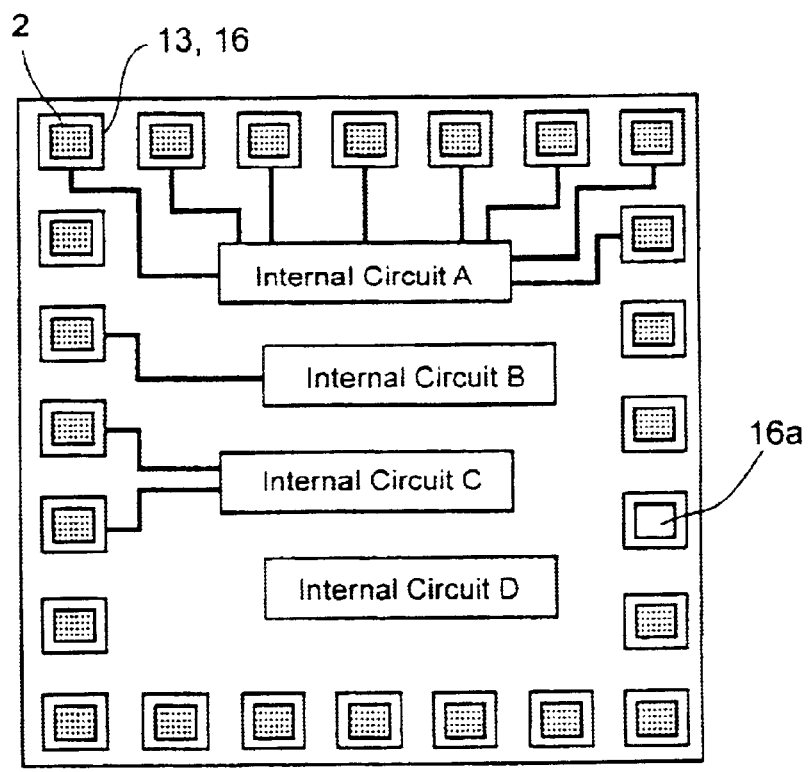
FIG. 3 is a simplified plan view of the semiconductor device embodying the invention showing a missing bump electrode.

FIG. 3 shows an example of the bump electrodes 16 formed on the pads 13 in the semiconductor device 1 among which a bump electrode is missing. In this figure, the missing bump electrode which is supposed to be formed is shown as an incomplete bump electrode 16a. According to the present invention, the incomplete bump electrode 16a, regardless of a location thereof, is detected as a dump electrode formed incompletely by conducting only the wafer test.

Figure 4:
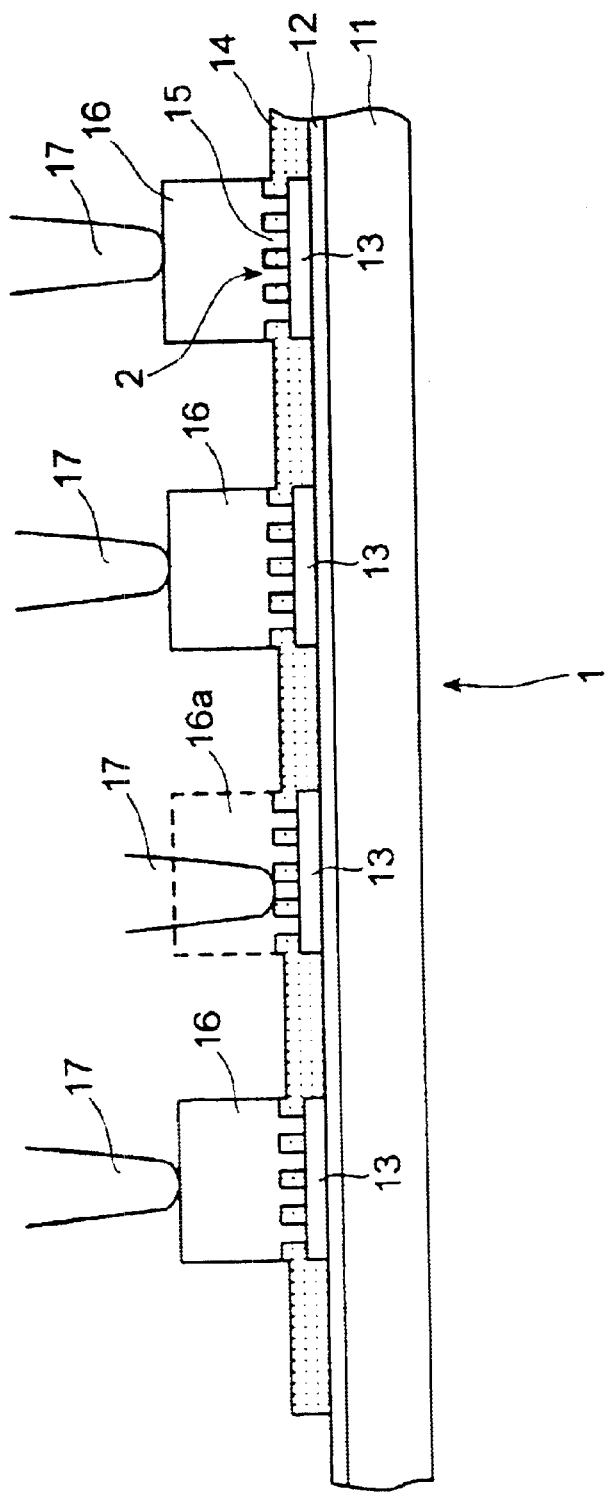
FIG. 4 is a simplified sectional view of the semiconductor device embodying the invention.

FIG. 4 is a simplified sectional view of the semiconductor device 1 showing how the semiconductor device 1 is inspected by using a probe needle during the wafer test.

When a so-called wafer test is conducted on the semiconductor device 1 having the bump electrode 16, a probe needle 17 is moved in a direction normal to the surface of the pad 13 so that the probe needle 17 comes in contact with or leaves from the semiconductor device 1. In other words, the probe needle 17 is brought into contact with each of the bump electrodes 16 in order to carry out a predetermined test. In a conventional semiconductor device, the surface protective film 14 is so formed as to leave the opening portion 2 on the pad 13 so as to expose an entire area of the pad 13. This means that an opening area of the opening 15 which forms the opening portion 2 becomes larger making even a narrowest width thereof is larger than a tip diameter of the probe needle 17 to allow the probe needle 17 to pass through the opening 15 easily.

Therefore, even in a case in which the semiconductor device 1 has an incomplete bump electrode such as the incomplete bump electrode 16a, the probe needle 17 touches the pad 13 without being prevented by the opening 15, in other words, by a rim of the opening 15, during the wafer test. Therefore, identical electrical characteristics are detected regardless of whether the bump 16 is present or not, thereby making it impossible to detect if such an incomplete bump electrode as the incomplete bump electrode 16a is present or not by conducting the wafer test alone.

Considering the deficiencies mentioned above, in the semiconductor device 1 of the present invention, a plurality of openings 15 are formed and arranged, for example, in a grid pattern when the opening portion 2 is formed in the surface protective film 14 on the pad 13. Within the opening 15 formed in this way, a portion of the bump electrode 16 is so formed as to keep contact with the pad 13.

In this structure, electrical continuity is achieved between the probe needle 17 and the pad 13 through the bump electrode 16 when the bump electrode 16 is properly formed. On the contrary, if the bump electrode 16 is missing or formed improperly, the probe needle 17 is prevented by the surface protective film 14 and can not pass through the opening 15. Consequently, electrical continuity is not achieved between the probe needle 17 and the pad 13, because the probe needle 17 is prevented from making contact with the pad 13.

In this way, it is possible to detect whether the bump electrode 16 is missing or not by conducting the wafer test alone, because different electrical characteristics are obtained during the wafer test depending on whether the bump electrode 16 is missing or not.

Figure 5:
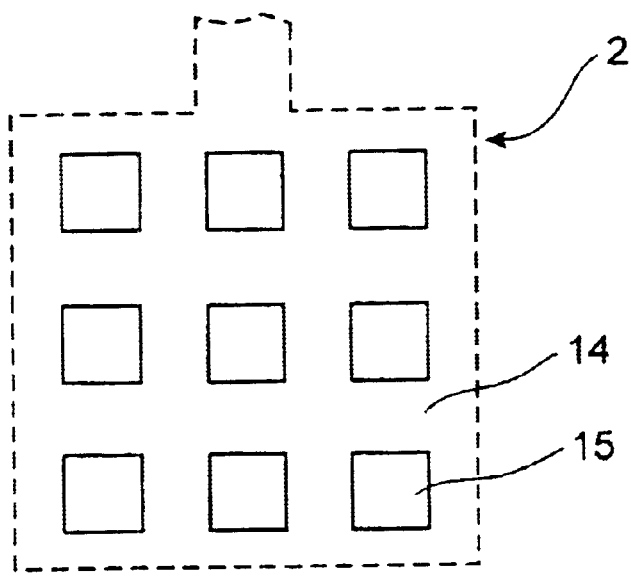
FIG. 5 is a diagram showing one shape of an opening portion of the semiconductor device embodying the invention.
Figure 6:
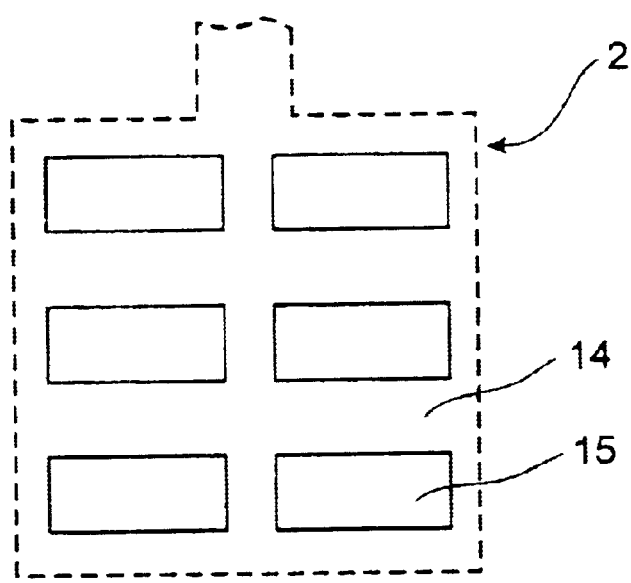
FIG. 6 is a diagram showing another shape of the opening portion of the semiconductor device embodying the invention.

FIGS. 5 and 6 show a structure of the opening portion 2 which is formed in the surface protective film 14 on the pad 13.

FIG. 5 shows a structure in which substantially square openings 15 are formed and arranged in a grid pattern in the opening portion 2 of the surface protective film 14. In addition, FIG. 6 shows another example in which rectangular openings 15 are formed in a grid pattern in the opening portion 2. In FIGS. 5 and 6, the openings 15 are formed along a normal line to the surface of the pad 13, i.e., along a perpendicular line to the surface of the pad 13.

Figure 7:
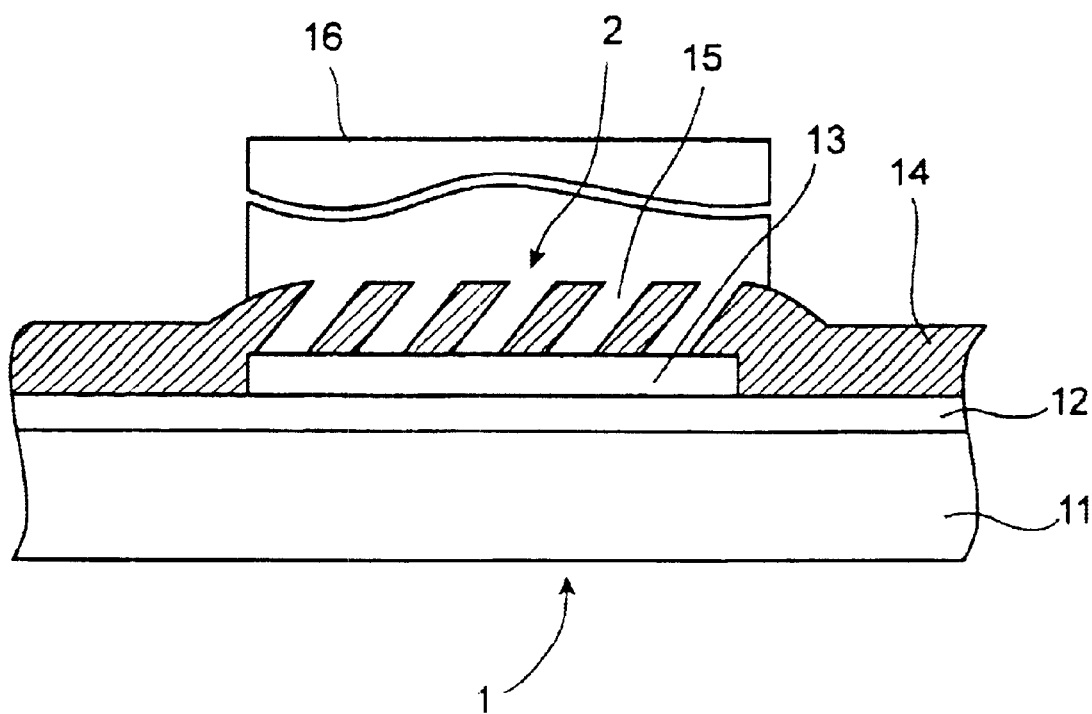
FIG. 7 is a simplified sectional view of the semiconductor device in which openings shown in FIG. 1 are tilted at an angle of 45 degrees to a surface of a pad.

FIG. 7 is a simplified sectional view of the semiconductor device 1 in which the openings 15 are tilted at an angle of 45 degrees to the surface of the pad 13. Same as the semiconductor device 1 shown in FIG. 1: 11 is a semiconductor chip; 2 is an opening portion; 12 is an insulating film; 13 is a pad for input and output; 14 is a surface protective film; and 16 is a bump electrode.

Figure 8:
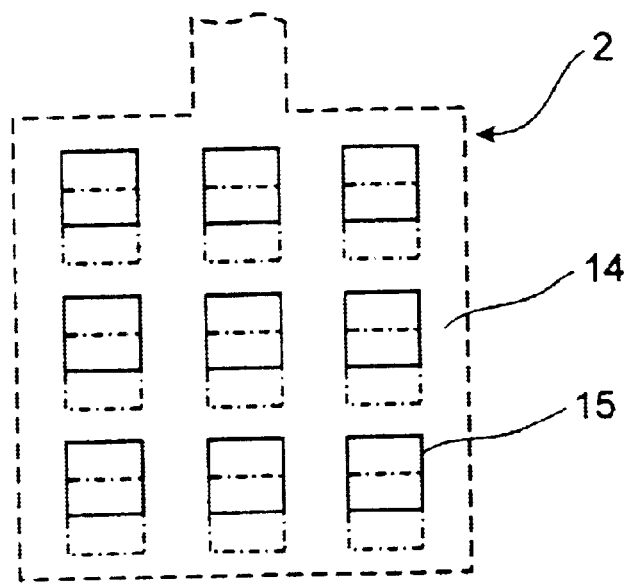
FIG. 8 is a diagram showing openings shown in FIG. 5 are tilted at an angle of 45 degrees to a surface of a pad.
Figure 9:
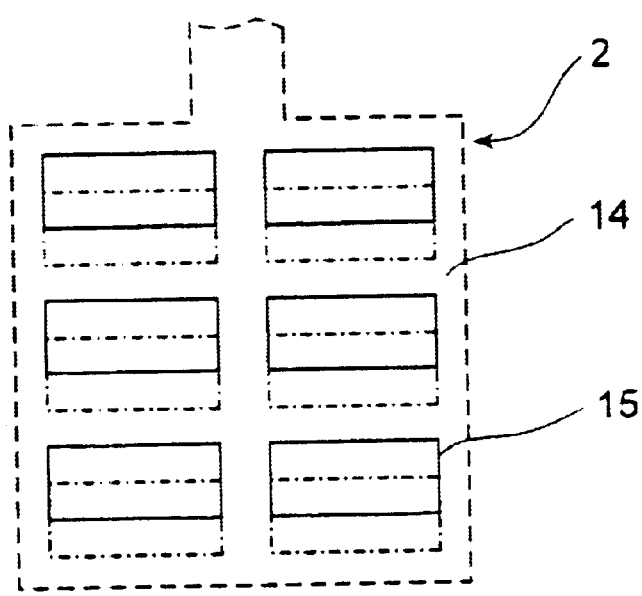
FIG. 9 is a diagram showing openings shown in FIG. 6 are tilted at an angle of 45 degrees to a surface of a pad.
Figure 10:
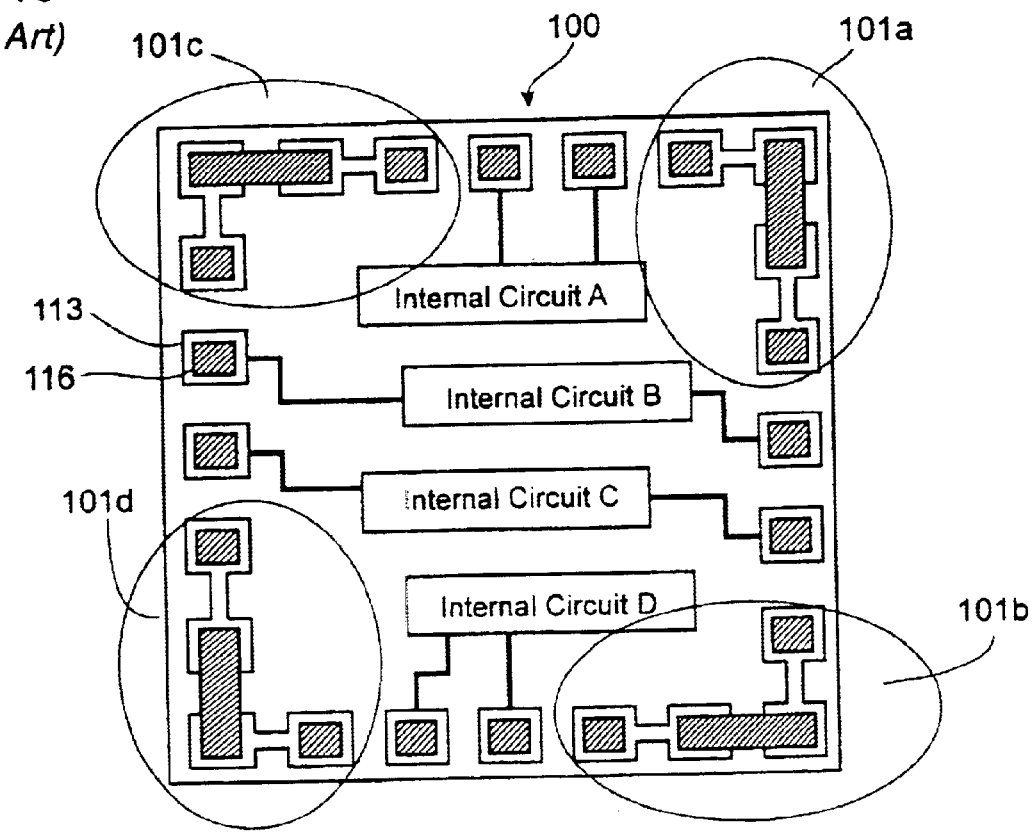
FIG. 10 is a diagram showing a structure of a conventional semiconductor chip.
Figure 11:
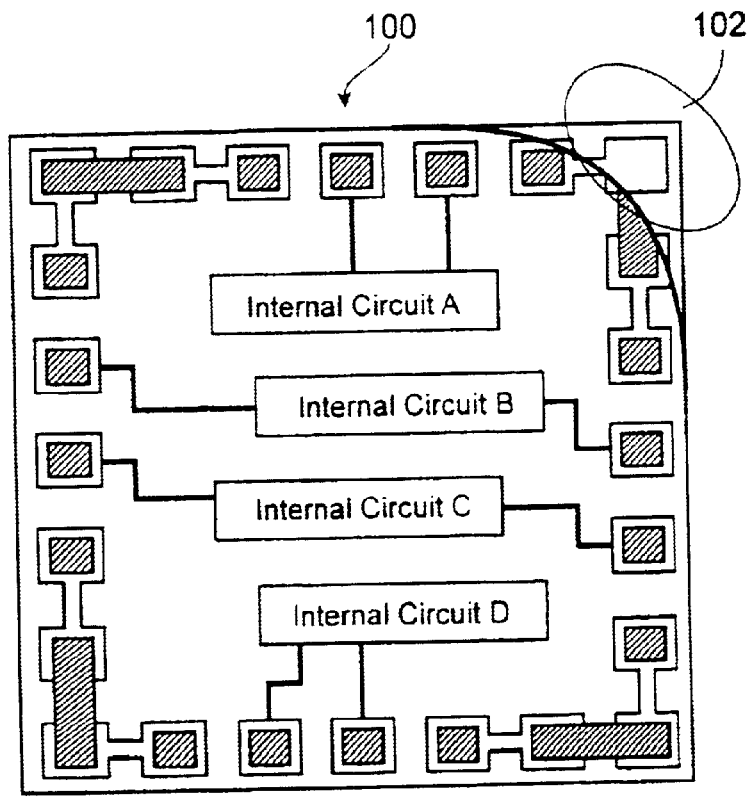
FIG. 11 is a diagram showing a structure of a conventional semiconductor chip having an incomplete bump electrode formed at a corner.

FIGS. 8 and 9, each corresponding to FIGS. 5 and 6, show the opening portion 2 comprising the openings 15 formed and tilted at 45 degrees to the surface of the pad 13. In these figures, solid lines show an upper end of the openings 15 and dashed lines show a lower end of the openings 15. When the openings 15 are formed in this way and the probe needle 17 is brought down from upward toward the incomplete bump electrode 16a as illustrated in FIG. 4, and, viewed in a direction of a normal line, if a diameter of the prove needle 17 is larger than an overlapping width of the opening 15, one drawn in solid lines and the other in dashed lines as shown in FIGS. 8 and 9, the probe needle 17 is interrupted by the surface protective film 14 and is unable to pass through the opening 15.

As described above, if the opening 15 are formed and tilted at a predetermined angle to a surface of the pad 13, the probe needle 17 which is brought up and down along a normal line to the surface of the pad 13 is made more difficult to pass through the opening 15. Accordingly, the opening 15 formed in this way can be made larger than the opening 15 formed along a normal line to the surface of the pad 13. The opening 15 formed and tilted at 45 degrees is an example and, therefore, this angle is not limited to 45 degrees as long as similar results are obtained.

Although FIGS. 5 and 6 show a structure in which the openings 15 are arranged in a grid pattern in the surface protective film 14 on the pad 13, there are no limitations to a shape and an arranging pattern of the openings 15 as long as one width thereof is made smaller than the tip diameter of the probe needle 17. Therefore, if the aforementioned conditions are met, the openings 15 forming the opening portion 2 can be arranged in a stripe pattern.

Next, each process in producing the semiconductor device 1 of the present invention will be described with reference to FIG. 4. First, the insulating film 12 is laid on an entire surface of the semiconductor chip 11 using a predetermined method. Although circuit elements such as transistors have been already formed in the semiconductor chip 11 through Chemical Vapor Deposition (CVD method), Ion Implantation, or other technologies, these elements are not illustrated in FIG. 4. As an example of the insulating film 12, BPSG (Boron Phosphorous Silicate Glass) film having a thickness of approximately 400 nm is laid through CVD method.

After forming openings at predetermined spots in the insulating film 12, a thin-metal film, such as Al or Al—Si, having a thickness of approximately 600 nm is laid on an entire surface of the semiconductor chip 11. Thereafter, interconnections between the transistors or the like and the pads 13 for input and output are formed using photolithography technologies and thin metal film etching technologies.

In these processes, although the pad 13 is assumed, for example, 60×110 μm in size and rectangular in shape, the size and shape are not limited to this example and it is also possible to make the pad 13 in a square shape.

Next, for example, Silicon Nitride film having a thickness of approximately 600 nm is laid through plasma CVD method as the surface protective film 14. In lieu of Silicon Nitride film, PSG (Phospho Silicate Glass) film, NSG (Non-doped Silicate Glass) film, or combined layers of these materials can be used as the surface protective film 14.

The opening portion 2 is formed in the surface protective film 14 on the pad 13 using photolithography technologies and surface protective film etching technologies. A photo mask used in this process is different from a photo mask used in a conventional process. Such a photo mask that can leave the surface protective film 14 in a grid pattern on the pad 13, for example, as shown in FIG. 5, is used.

A size of an opening, that is, the opening 15, formed in the surface protective film 14, can be any size if it is smaller than the tip diameter of the probe needle 17. In the process described herein, each opening 15 is of substantially a square shape having a 5 μm side thereof, and a distance between each of the openings 15 arranged in the surface protective film 14 is set at approximately 5 μm.

In this opening portion 2, for example, a total area taken by all of the openings 15 is set at approximately 30×55 μm for a surface area of the pad 13 of approximately 60×110 μm. A size of the opening portion 2 which is equal to the total area of all of the openings 15, can be determined depending on electrical current or power passing through the pad 13. It is also possible to make the size of each opening portion 2 identical with or different from each other.

Next, the bump electrode 16 is formed using Au, for example, through electrolytic plating process by masking a photoresist,. Au, approximately 20 μm in thickness, is plated through electrolytic plating process in this example.

The thickness of the Au plating, that is, a height of the bump electrode 16, can be determined according to a type of the semiconductor device 1 or a requirement of a printed circuit board on which the semiconductor device 1 is mounted. In addition, if Au is used for formation of the bump electrode 16, it is an effective way to use barrier metal to prevent interactions between Au for forming the bump electrode 16 and Al for forming the pad 13 from occurring.

It is also possible to use solder instead of Au for forming the bump electrode 16. The semiconductor chip 11 will be mounted in the semiconductor device 1 after the bump electrodes 16 are formed. After the semiconductor device 1 is produced in this way, the wafer test using the probe needle 17 as described before is conducted. During the wafer test, if any of the bump electrodes 16 is found to be missing or incomplete, the semiconductor device 1 is rejected as defective.

According to the present invention, as described before, the present invention provide the following advantages.

According to the present invention, it is possible to conduct an automated inspection, without requiring any special testing apparatus, for detecting an incomplete bump electrode of a semiconductor device, which has been conducted manually through a visual check. Accordingly, time required for detecting the incomplete bump electrode is shortened. Furthermore, the present invention contributes to preventing a defective semiconductor device 1 from being shipped due to possible mistakes occurring during the visual inspection and, therefore, contributes to ensuring higher quality and reliability of a printed circuit board or the like on which the semiconductor device 1 is mounted.

According to one aspect of the present invention, one or a plurality of openings through which a pad contacts with a bump electrode and of which one width is smaller than a tip diameter of a probe needle so as to prevent the probe needle from passing through the opening is formed in a surface protective film laid on a semiconductor chip in a region on the pad. In this configuration, electrical continuity between the probe needle and the pad is achieved if the bump electrode is properly formed, and the electrical continuity is not achieved because the probe needle is prevented by said opening if the bump electrode is incompletely formed. Because the probe detects different electrical characteristics in accordance with whether the bump electrode is complete or not, it is possible to check for the incomplete bump electrode by a wafer test alone.

According to another aspect of the present invention, the opening portion is so formed as to have the openings arranged in a grid pattern or a stripe pattern. Since a shape of the opening portion is thus simple, reshaping a photo mask during photolithography process in which the surface protective film is processed is made easier. Accordingly, forming the opening portion is also becomes easier.

According to still another aspect of the present invention, the opening portion is so formed as to have the opening inclined from a direction normal to the surface of the pad. In this structure, one width of an overlapping area formed by projecting an upper end and a lower end of the opening in a direction normal to the surface of the pad is smaller than the tip diameter of the probe needle. This structure further prevents the probe needle from penetrating through the opening portion and achieving electrical continuity between the probe needle and the pad if the bump electrode is incompletely formed. Alternately, it is possible to form a larger opening than when the opening is formed along a normal line to the surface of the pad. Because the opening is larger, it makes a process of forming the opening portion easier.

According to still another aspect of the present invention, in a process of forming a surface protective film when a semiconductor device is produced, one or a plurality of openings through which a pad contacts with a bump electrode and of which one width is smaller than a tip diameter of a probe needle so as to prevent the probe needle from passing therethrough is formed in a surface protective film laid on a semiconductor chip in a region on the pad. The surface protective film is so formed as to prevent the probe needle from making contact with the pad if the bump electrode is not properly formed within the opening. Because of this, electrical continuity is achieved between the probe needle and the pad through the bump electrode if the bump electrode is completely formed, and electrical continuity is prevented by the opening and is not achieved between the probe needle and the pad if the bump electrode is incompletely formed. Because the probe detects different electrical characteristics depending on whether the bump electrode is complete or not, it is possible to check for the incomplete bump electrode by a wafer test alone.

According to still another aspect of the present invention, when a semiconductor chip mounted in a semiconductor device is checked for good or not by bringing a probe needle into contact with the semiconductor chip and measuring electrical characteristics, an incomplete bump electrode is detected if it is not properly formed because a surface protective film is so formed that an opening portion having an opening of which width is smaller than a tip of the probe needle prevents electrical contact between the tip of the probe needle and the pad from being achieved. Therefore, when a test is conducted for detecting any incomplete formation such as the bump electrode, it is possible to reduce a cost incurred in the test, because no expensive testing apparatus is required and labor or the like for conducting a visual inspection is saved. Additionally, this contributes to enhancing reliability of the semiconductor device because mistakes during the test such as overlooking the incomplete bump electrode can hardly occur.

As a whole, according to the present invention, it is possible to provide a semiconductor device, its manufacturing process, and its inspecting method by which a bump electrode formed improperly in the semiconductor device is detected by simple means without using a specially arranged apparatus.

What is claimed is:

1. A semiconductor device comprising:

a semiconductor chip;

a pad formed at a predetermined location on a surface of the semiconductor chip;

a surface protective film formed on the surface of the semiconductor chip except on a part of a surface of the pad;

an opening portion left in the surface protective film on said part of the surface of the pad; and a bump electrode formed through the opening portion so as to contact with the pad, wherein said opening portion comprises one or a plurality of openings having a width thereof smaller than a predetermined value, the opening has a first opening end at a side of the pad and a second opening end at a side opposite to the first opening end, and one width of an overlapping area formed by projecting the first opening end and the second opening end in a direction normal to the surface of the pad is smaller than a tip diameter of a probe needle for measuring electrical characteristics of the semiconductor device.

2. A semiconductor device as claimed in claim 1, wherein the opening portion comprises a plurality of openings and the plurality of openings are arranged in a grid pattern.

3. A semiconductor device as claimed in claim 1, wherein the opening portion comprises a plurality of openings and the plurality of openings are arranged in a stripe pattern.

4. A semiconductor device as claimed in claim 1, wherein the opening is formed along a normal line to the surface of the pad.

5. A semiconductor device as claimed in claim 1, wherein the opening is formed with an inclination to a normal line to the surface of the pad.

6. A process of producing a semiconductor device comprising:

forming a pad at a predetermined location on a surface of the semiconductor chip;

laying a surface protective film on the surface of the semiconductor chip except on a part of a surface of the pad; and forming a bump electrode through an opening portion left in the surface protective film on said part of the surface of the pad so as to contact with the pad, wherein, when the surface protective film is laid, said opening portion is so formed as to have one or a plurality of openings, each having a first opening end at a side of the pad and a second opening end at a side opposite to the first opening end, so that one width of an overlapping area formed by projecting the first opening end and the second opening end in a direction normal to the surface of the pad becomes smaller than a tip diameter of a probe needle for measuring electrical characteristics of the semiconductor device.

7. A process of producing a semiconductor device as claimed in claim 6, wherein the opening portion comprises a plurality of openings and the plurality of openings are arranged in a grid pattern.

8. A process of producing a semiconductor device as claimed in claim 6, wherein the opening portion comprises a plurality of openings and the plurality of openings are arranged in a stripe pattern.

9. A process of producing a semiconductor device as claimed in claim 6, wherein the opening is formed along a normal line to the surface of the pad.

10. A process of producing a semiconductor device as claimed in claim 6, wherein the opening is formed with an inclination to a normal line to the surface of the pad.

11. A method for testing a semiconductor device having a pad formed at a predetermined location on a surface of a semiconductor chip, a surface protective film laid on the surface of the semiconductor chip except on a part of a surface of the pad, and a bump electrode formed through an opening portion left in the surface protective film on said part of the surface of the pad so as to contact with the pad, the method including bringing a probe needle for measuring electrical characteristics of the semiconductor device in a direction substantially normal the surface of the pad so that the probe needle comes in contact with the semiconductor device, wherein the method comprises detecting the bump electrode as defective if the bump electrode is incompletely formed and an electrical contact between a tip of the probe needle and the pad is prevented by the opening portion so formed as to have an opening of which one side is smaller than a tip diameter of the probe needle.

* * * * *